US011056808B2

(12) United States Patent
Sasaki et al.

(10) Patent No.: US 11,056,808 B2
(45) Date of Patent: Jul. 6, 2021

(54) RESIN MULTILAYER SUBSTRATE, TRANSMISSION LINE, MODULE, AND METHOD OF MANUFACTURING MODULE

(71) Applicant: Murata Manufacturing Co., Ltd., Nagaokakyo (JP)

(72) Inventors: Jun Sasaki, Nagaokakyo (JP); Yoichi Saito, Nagaokakyo (JP); Takahiro Baba, Nagaokakyo (JP); Fumie Matsuda, Nagaokakyo (JP); Yoshitomo Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 151 days.

(21) Appl. No.: 16/266,156

(22) Filed: Feb. 4, 2019

(65) Prior Publication Data

US 2019/0173208 A1 Jun. 6, 2019

Related U.S. Application Data

(63) Continuation of application No. PCT/JP2017/028209, filed on Aug. 3, 2017.

(30) Foreign Application Priority Data

Aug. 26, 2016 (JP) .............................. JP2016-166336

(51) Int. Cl.
*H01P 3/08* (2006.01)
*H01R 12/71* (2011.01)
(Continued)

(52) U.S. Cl.
CPC ........... *H01R 12/714* (2013.01); *H01P 3/085* (2013.01); *H01P 3/088* (2013.01); *H01P 11/003* (2013.01);
(Continued)

(58) Field of Classification Search
CPC .. H01P 3/08; H01P 3/085; H01P 3/081; H01P 3/082; H01R 12/714
See application file for complete search history.

(56) References Cited

U.S. PATENT DOCUMENTS 6,051,093 A 4/2000 Tsukahara
2013/0127560 A1 5/2013 Kato et al.
(Continued)

FOREIGN PATENT DOCUMENTS

JP 2014-086655 A 5/2014
JP 2016-034026 A 3/2016
(Continued)

OTHER PUBLICATIONS

Official Communication issued in International Patent Application No. PCT/JP2017/028209, dated Oct. 10, 2017.

*Primary Examiner* — Stephen E. Jones
(74) *Attorney, Agent, or Firm* — Keating & Bennett, LLP

(57) ABSTRACT

A module includes a multilayer body that includes insulating-resin base members laminated together, first and second main surfaces, and first and second regions when viewed in plan view. A first conductor pattern and a protective film that covers the first conductor pattern are provided in the first region of the first main surface. Second conductor patterns and holes that extend to the second conductor patterns are provided in the second region of the multilayer body. The holes are provided with conductive joining materials, and connectors are connected to the second conductor patterns by the conductive joining materials.

19 Claims, 6 Drawing Sheets

(51) Int. Cl.
*H05K 3/32* (2006.01)
*H05K 3/46* (2006.01)
*H05K 3/28* (2006.01)
*H05K 1/02* (2006.01)
*H01P 11/00* (2006.01)

(52) U.S. Cl.
CPC ............. *H05K 1/02* (2013.01); *H05K 3/28* (2013.01); *H05K 3/32* (2013.01); *H05K 3/46* (2013.01)

(56) References Cited

U.S. PATENT DOCUMENTS

| | | |
|---|---|---|
| 2015/0054601 A1 | 2/2015 | Ikemoto et al. |
| 2015/0181699 A1 | 6/2015 | Ikemoto et al. |
| 2018/0123206 A1 | 5/2018 | Yosui |

FOREIGN PATENT DOCUMENTS

| | | |
|---|---|---|
| WO | 97/47031 A1 | 12/1997 |
| WO | 2012/074101 A1 | 6/2012 |
| WO | 2014/069061 A1 | 5/2014 |
| WO | 2014/103772 A1 | 7/2014 | ued
RESIN MULTILAYER SUBSTRATE, TRANSMISSION LINE, MODULE, AND METHOD OF MANUFACTURING MODULE

CROSS REFERENCE TO RELATED APPLICATIONS

This application claims the benefit of priority to Japanese Patent Application No. 2016-166336 filed on Aug. 26, 2016 and is a Continuation Application of PCT Application No. PCT/JP2017/028209 filed on Aug. 3, 2017. The entire contents of each application are hereby incorporated herein by reference.

BACKGROUND OF THE INVENTION

1. Field of the Invention

The present invention relates to a resin multilayer substrate that includes a multilayer body including a plurality of insulating-resin base members, a transmission line and a module that include the resin multilayer substrate, and a method of manufacturing the module.

2. Description of the Related Art

In the related art, various electronic component modules include resin multilayer substrates each of which includes a plurality of insulating-resin base members laminated together. For example, International Publication No. 2012/074101 discloses a module in which a resin multilayer substrate includes a transmission line having a stripline structure and connectors that are to be connected to an external circuit are mounted on the resin multilayer substrate, so that the module is used as a cable.

In the module disclosed in International Publication No. 2012/074101, a protective layer is formed on a surface of the resin multilayer substrate such that electrodes for mounting the connectors are exposed on the surface, and the connectors are joined to the electrodes.

In a module having a structure such as that described above, since electrodes that are to be joined to connectors are provided on the bottom surfaces of the connectors, and the connectors are disposed so as to overlap a protective layer formed on a surface of a resin multilayer substrate, the thicknesses of connector mounting portions inevitably become large. Thus, when the module is included in an electronic device, the connector mounting portions are likely to come into contact with other structural members or other electronic components, and this becomes a factor that hinders reductions in the size and thickness of the electronic device.

SUMMARY OF THE INVENTION

Preferred embodiments of the present invention provide resin multilayer substrates in each of which the thickness of a component mounting portion is reduced, and also provide transmission lines and modules that include the resin multilayer substrates, and methods of manufacturing the modules.

A resin multilayer substrate according to a preferred embodiment of the present invention includes a multilayer body that includes a plurality of insulating-resin base members, which are laminated together, and includes a first main surface and a second main surface, the multilayer body including a first region and a second region when viewed in plan view, a first conductor pattern that is provided in the first region of the first main surface, a protective film that is provided in the first region of the first main surface and that covers the first conductor pattern, a second conductor pattern that is provided in at least the second region of an inner layer of the multilayer body, and a hole that is provided in the second region of the first main surface and that extends to the second conductor pattern. The second region of the first main surface is a region in which the first conductor pattern and the protective film are not provided.

With the above-described configuration, the thickness of the second region is smaller than that of the first region, and as a result of a component being mounted in the second region, the height of the component from a surface of the multilayer body is small, and the thickness of a component mounting portion is reduced. In addition, it is not necessary to provide a joining electrode to join a mounting component in the second region, and accordingly, the height of the component is able to be further reduced by an amount equal to the thickness of the electrode. Furthermore, there will be no problem of separation due to a reduction in the area of the joining electrode.

It is preferable that the multilayer body includes a thin-layer portion that is located in the first region and in which a number of the insulating-resin base members laminated together is smaller than a number of the insulating-resin base members laminated together in another portion of multilayer body. As a result, the resin multilayer substrate has flexibility without reducing the rigidity of the component mounting portion.

It is preferable that the second conductor pattern extends through the thin-layer portion when the multilayer body is viewed in plan view, and it is preferable that the multilayer body further includes an interlayer connection conductor that provides interlayer connection between the first conductor pattern and the second conductor pattern. With this configuration, the mounting component is able to be electrically connected to the first conductor pattern provided on the first main surface while the multilayer body includes the thin-layer portion.

A transmission line according to a preferred embodiment of the present invention includes the above-described resin multilayer substrate, and the first conductor pattern is a ground conductor pattern, and the entire second conductor pattern or a portion of the second conductor pattern is a signal conductor pattern extending along the first conductor pattern.

With the above-described configuration, the ground conductor pattern and the signal conductor pattern define a stripline or a microstripline.

A module according to a preferred embodiment of the present invention includes the above-described resin multilayer substrate, a conductive joining material that is provided in the hole and that has a melting point lower than a remelting temperature of a conductor that defines an interlayer connection conductor provided in an inner layer of the multilayer body, and a component that is connected to the second conductor pattern by the conductive joining material and that is mounted on the multilayer body.

With the above-described configuration, the module in which the height of the component from a surface of the multilayer body is small and in which the thickness of a component mounting portion is small is able to be obtained.

The module may further include an interlayer connection conductor that is provided in the hole and that is electrically connected to the conductive joining material. As a result, the amount of the conductive joining material to be provided in the hole is able to be reduced, and the conductive joining material is able to be used even in the case in which the hole is deep.

The component is, for example, a connector that is connected to an external circuit. As a result, the module is able to be used as a connector-equipped cable.

A method of manufacturing a module includes a conductor-pattern forming step of forming a first conductor pattern onto a predetermined insulating-resin base member included in a plurality of insulating-resin base members and a second conductor pattern onto another predetermined insulating-resin base member included in the plurality of insulating-resin base members, an interlayer-connection-conductor forming step of forming an interlayer connection conductor in a predetermined insulating-resin base member included in the plurality of insulating-resin base members, a multilayer-body forming step of forming a multilayer body, and melting and forming the interlayer connection conductor by laminating the plurality of insulating-resin base members together and hot-pressing the plurality of insulating-resin base members such that the first conductor pattern is disposed on a first main surface and the second conductor pattern are disposed in an inner layer, a protective-film forming step of forming a protective film that covers a first region of the first main surface of the multilayer body and exposes a second region of the first main surface of the multilayer body when the multilayer body is viewed in plan view, a hole forming step of forming a hole in the second region of the first main surface of the multilayer body after the multilayer-body forming step has been performed, the hole extending to the second conductor pattern, a conductive-joining-material providing step of providing a conductive joining material into at least a portion of the hole, the conductive joining material having a melting point lower than a remelting temperature of the interlayer connection conductor, and a component mounting step of mounting a component onto the multilayer body through the conductive joining material.

According to the above-described manufacturing method, the conductive joining material that electrically connects the component to the first conductor pattern and the second conductor pattern is able to easily be formed, and a module in which the height of a component mounting portion is small is able to be easily obtained.

According to preferred embodiments of the present invention, resin multilayer substrates in each of which the thickness of a component mounting portion is reduced, and transmission lines and modules that include the resin multilayer substrates are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
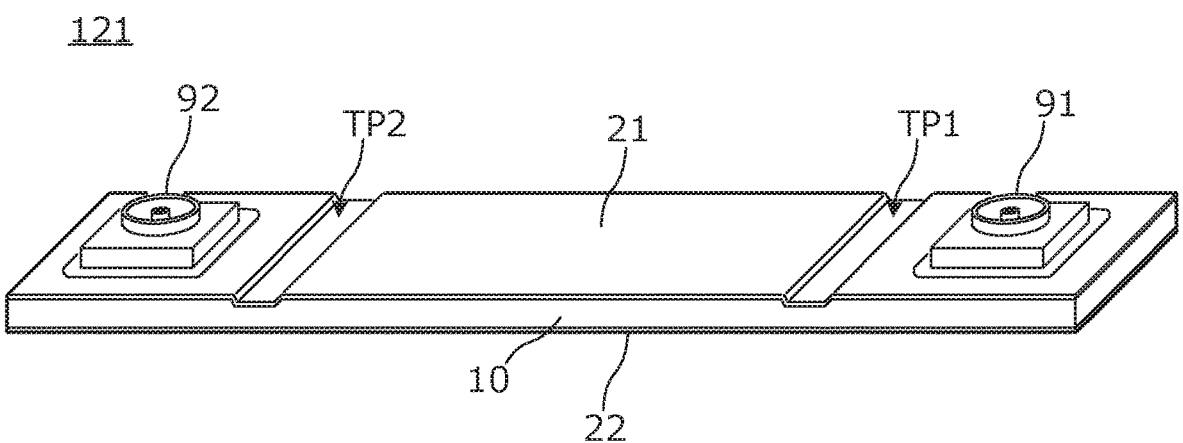
FIG. 1 is a perspective view of a module according to a first preferred embodiment of the present invention.

A plurality of preferred embodiments of the present invention will be described below using some specific examples with reference to the drawings. The same or similar members and elements illustrated in the drawings are denoted by the same reference signs. Although the preferred embodiments will be separately described for ease of explaining or understanding the gist of the present invention, the configurations according to the different preferred embodiments may be partially replaced with each other or may be combined with each other. In a second preferred embodiment, descriptions of matters that are common to a first preferred embodiment will be omitted, and only differences will be described. In particular, similar advantageous effects obtained with similar configurations will not be described in every preferred embodiment.

First Preferred Embodiment

FIG. 1 is a perspective view of a module 121 according to a first preferred embodiment of the present invention. The module 121 is used as a connector-equipped high-frequency cable. For example, the module 121 is preferably connected between an antenna and a high-frequency circuit in an electronic device, such as a smartphone.

The module 121 includes a multilayer body 10 including a plurality of insulating-resin base members, protective films 21 and 22 provided on surfaces of the multilayer body 10, and connectors 91 and 92 mounted on the multilayer body 10. The multilayer body 10 includes thin-layer portions TP1 and TP2 that are located in the vicinity of portions on which the connectors 91 and 92 are mounted.

Figure 2A:
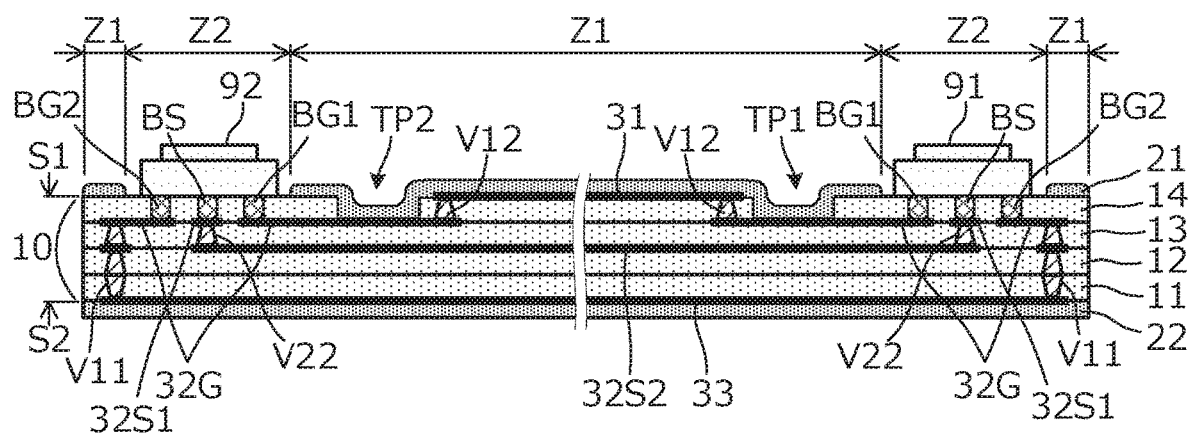
FIG. 2A is a sectional view of the module.
Figure 2B:
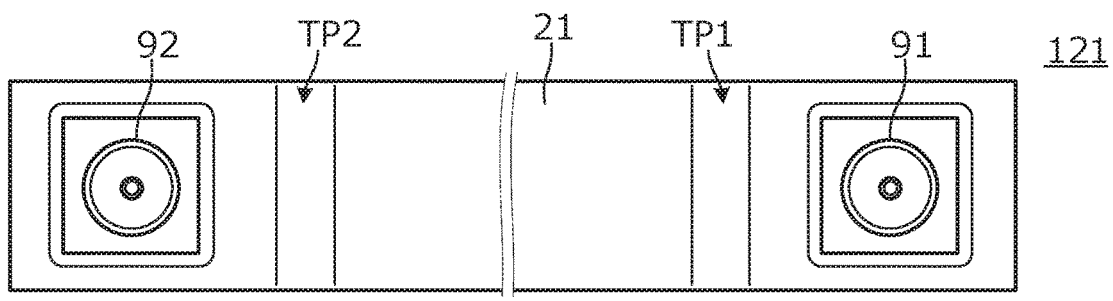
FIG. 2B is a plan view of the module according to the first preferred embodiment of the present invention.
Figure 2C:
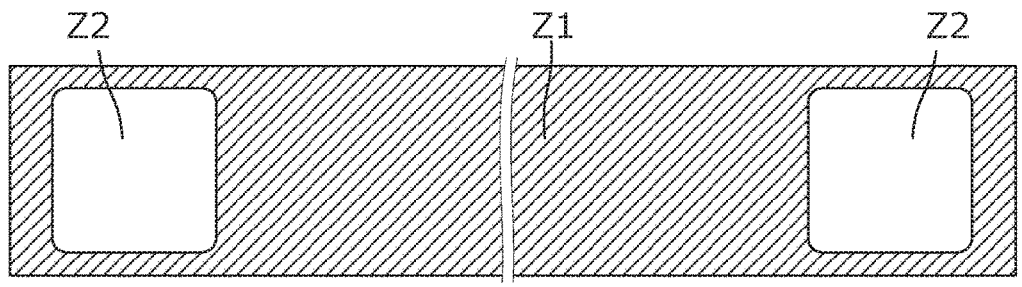
FIG. 2C is a plan view illustrating a first region and second regions of the module according to the first preferred embodiment of the present invention.
Figure 3A:
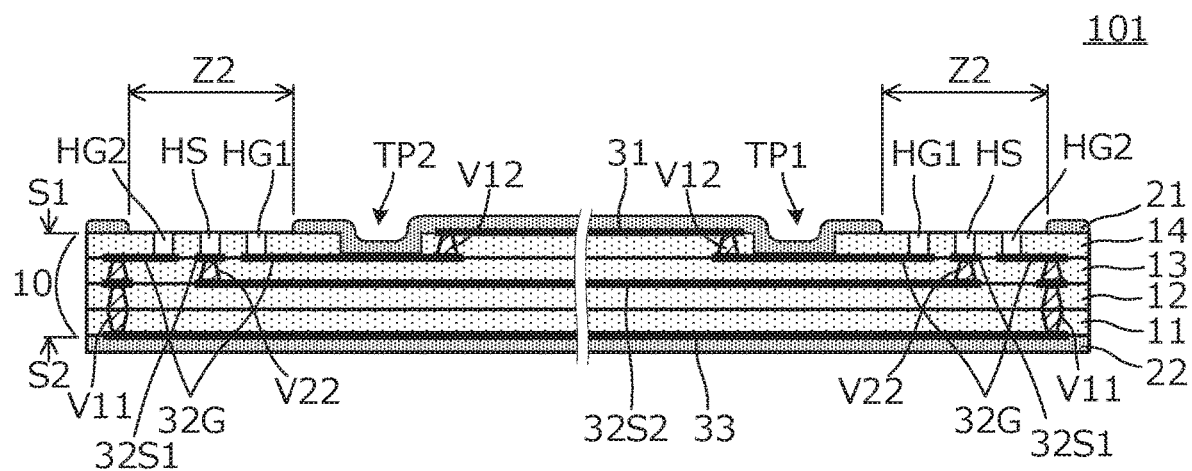
FIG. 3A is a sectional view of a resin multilayer substrate of the module according to the first preferred embodiment of the present invention before connectors are mounted on the resin multilayer substrate.
Figure 3B:
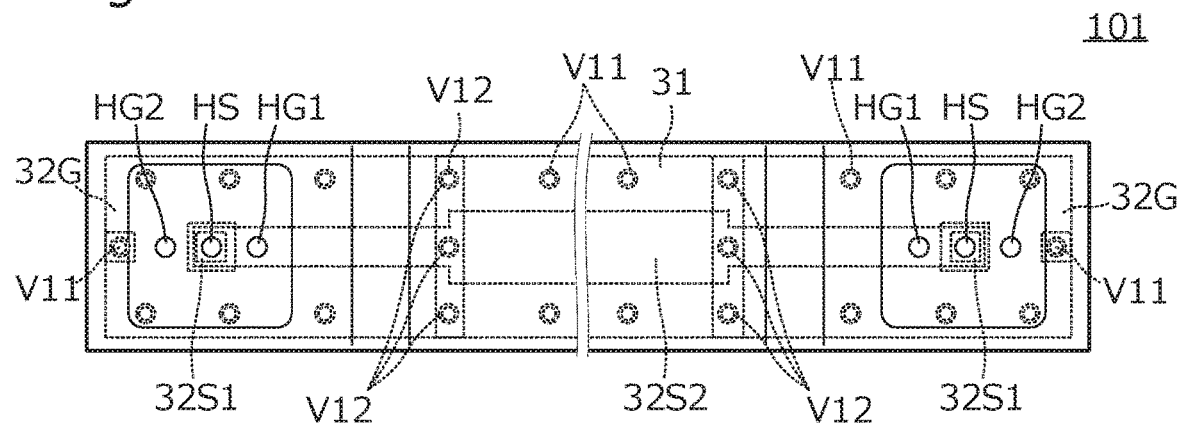
FIG. 3B is a plan view of the resin multilayer substrate illustrated in FIG. 3A.

FIG. 2A is a sectional view of the module 121. FIG. 2B is a plan view of the module 121. FIG. 2C is a plan view illustrating a first region and second regions, which will be described later. FIG. 3A is a sectional view of a resin multilayer substrate 101 before the connectors 91 and 92 are mounted on the resin multilayer substrate 101, and FIG. 3B is a plan view of the resin multilayer substrate 101 illustrated in FIG. 3A.

The multilayer body 10 includes insulating-resin base members (hereinafter simply referred to as "base members") 11, 12, 13, and 14. When viewed in plan view, the multilayer body 10 includes a first region Z1 and second regions Z2, and the protective film 21 covers the first region Z1 of a first main surface S1 of the multilayer body 10. The protective film 22 covers the entire or substantially the entire second main surface S2 of the multilayer body 10.

A first conductor pattern 31 is provided on a top surface of the base member 14, that is, the first main surface S1 of the multilayer body 10. Second conductor patterns 32G and 32S1 are provided on a top surface of the base member 13 (in an inner layer of the multilayer body 10). A second conductor pattern 32S2 is provided on a top surface of the base member 12 (in an inner layer of the multilayer body 10). A third conductor pattern 33 is provided on a bottom surface of the base member 11, that is, the second main surface S2 of the multilayer body 10.

In the present preferred embodiment, the first conductor pattern 31 is an upper ground conductor extending in a planar manner, and the second conductor patterns 32G are each an upper ground conductor extending in a planar manner. The third conductor pattern 33 is a lower ground conductor extending in a planar manner. The second conductor patterns 32S1 and 32S2 are signal conductor patterns. The second conductor pattern 32S2 extends linearly between the upper ground conductors (the first conductor pattern 31 and the second conductor patterns 32G) and the lower ground conductor (the third conductor pattern 33).

The base member 13 includes interlayer connection conductors (via conductors) V22 electrically connecting the second conductor patterns 32S1 and the second conductor pattern 32S2 to each other. The base member 14 includes a plurality of interlayer connection conductors V12 electrically connecting the first conductor pattern 31 and the second conductor patterns 32G to each other. The base members 11, 12, 13, and 14 include a plurality of interlayer connection conductors V11 electrically connecting the first conductor pattern 31 and the third conductor pattern 33 to each other. Similarly, the base members 11, 12, and 13 include another plurality of interlayer connection conductors V11 electrically connecting the second conductor patterns 32G and the third conductor pattern 33 to each other.

The first conductor pattern 31 and the second conductor patterns 32G, which are the upper ground conductors, the second conductor pattern 32S2, which is one of the signal conductor patterns, and the third conductor pattern 33, which is the lower ground conductor, define a stripline.

The thin-layer portions TP1 and TP2 do not include the base member 14, and the number of the laminated base members in each of the thin-layer portions TP1 and TP2 is smaller than the number of the laminated base members in the other portions. The protective film 21 extends along the thin-layer portions TP1 and TP2 and covers the first main surface S1 of the multilayer body 10.

As illustrated in FIG. 3A, holes HG1 and HG2 extending to the second conductor patterns 32G and holes HS extending to the second conductor patterns 32S1 are provided in the second regions Z2 of the first main surface S1 of the multilayer body 10. As illustrated in FIG. 2A, conductive joining materials BG1, BG2, and BS are provided in the holes HG1, HG2, and HS, respectively, and the connectors 91 and 92 are electrically connected to the second conductor patterns 32G and 32S1 by the conductive joining materials BG1, BG2, and BS.

The conductive joining materials BG1, BG2, and BS are preferably, for example, Sn-based solder, and the melting point of each of the conductive joining materials BG1, BG2, and BS is lower than the remelting temperature of each of the interlayer connection conductors V11, V12, and V22.

The second conductor pattern 32S2 in a first portion that extends along the first conductor pattern 31 (a portion of the multilayer body 10 in which the second conductor pattern 32S2 is sandwiched between the first conductor pattern 31 and the third conductor pattern 33) has a line width different from the line width of the second conductor pattern 32S2 in second portions that extend along the second conductor patterns 32G (portions of the multilayer body 10 in which the second conductor pattern 32S2 is sandwiched between the second conductor patterns 32G and the third conductor pattern 33). Although the characteristic impedance of the stripline is constant, in the first portion, the distance between the second conductor pattern 32S2, which is one of the signal conductor patterns, and the first conductor pattern 31, which is the upper ground conductor, in a lamination direction is large, and thus, the second conductor pattern 32S2 in the first portion has a line width wider than that of the second conductor pattern 32S2 in the other portions of the multilayer body 10.

The second portions include only the second regions Z2, in which the connectors 91 and 92 are mounted, and the thin-layer portions TP1 and TP2, which are located in the vicinity of the second regions Z2, and thus, the signal conductor pattern includes a large percentage of the wider line width portion. In other words, while the module (connector-equipped high-frequency cable) is thin, conductor loss due to the signal conductor pattern is able to be maintained small, and insertion loss of a transmission line is able to be maintained low.

Figure 4:
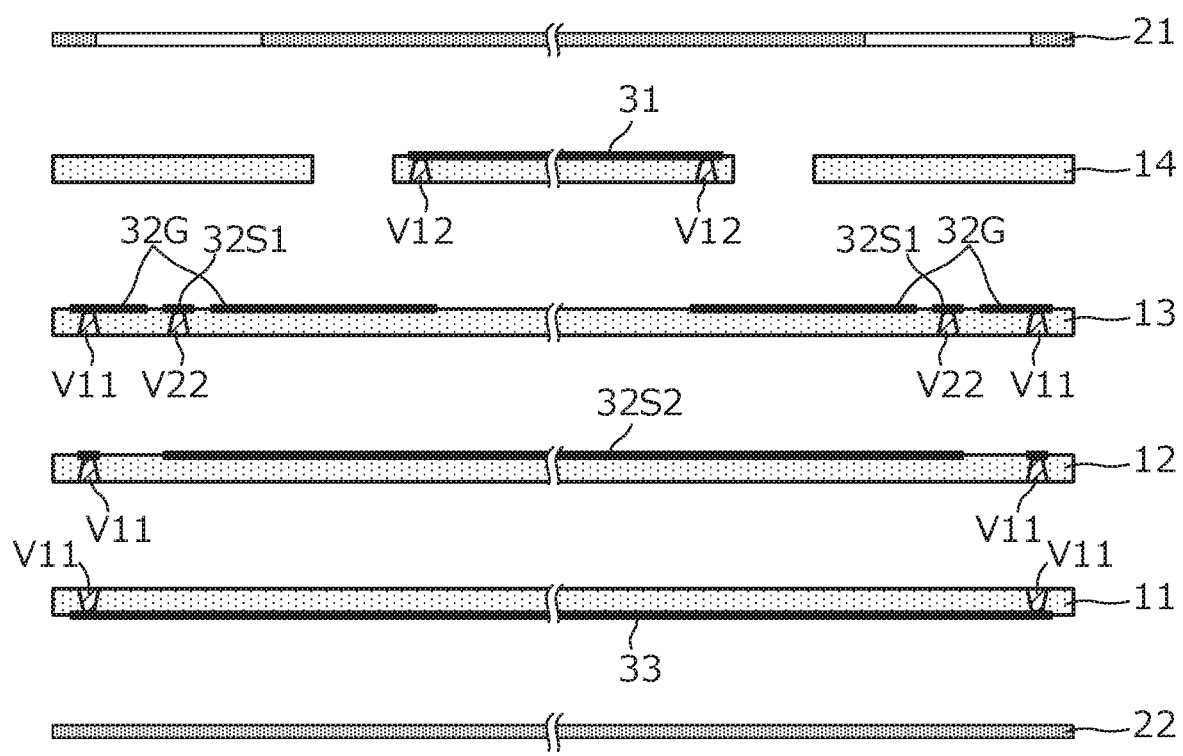
FIG. 4 is a sectional view illustrating, together with protective films, a multilayer body of the module according to the first preferred embodiment of the present invention before undergoing hot pressing.
Figure 5:
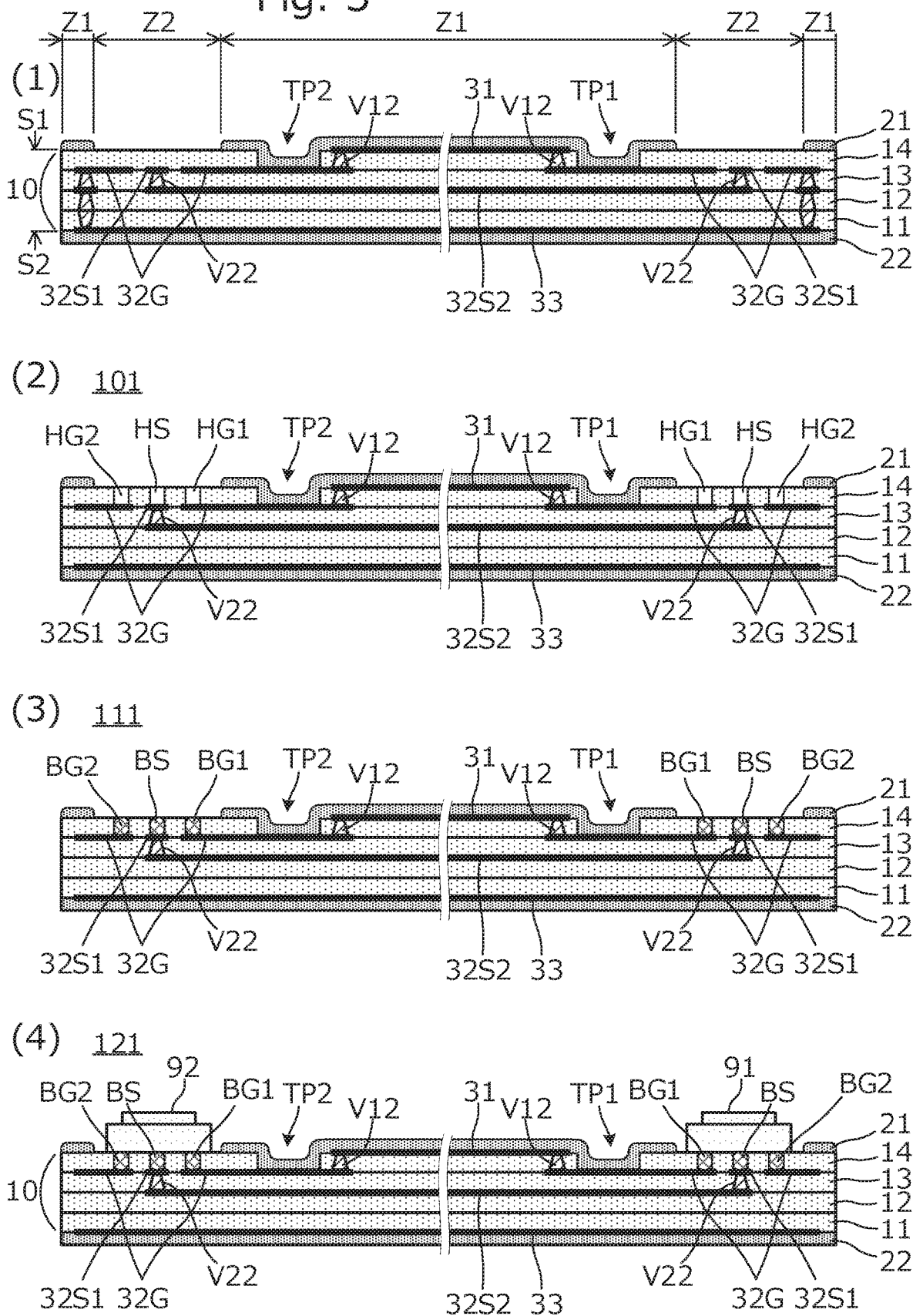
FIG. 5 is a sectional view of the module according to the first preferred embodiment of the present invention in each manufacturing step.

A method of manufacturing the module 121 will now be described with reference to FIG. 4 and FIG. 5. FIG. 4 is a sectional view illustrating, together with the protective films 21 and 22, the multilayer body 10 before undergoing hot pressing. FIG. 5 is a sectional view of the module 121 in each manufacturing step.

The first conductor pattern 31 is formed on the base member 14. The second conductor patterns 32G and 32S1 are formed on the base member 13. The second conductor pattern 32S2 is formed on the base member 12. The third conductor pattern 33 is formed on the base member 11. For example, each of these conductor patterns is preferably formed by attaching a Cu foil to a liquid crystal polymer (LCP) sheet and patterning the Cu foil by photolithography. Note that each of the conductor patterns is not limited to being formed by using a Cu foil, and other metal foils may be used.

The interlayer connection conductors V12 are formed in the base member 14. The interlayer connection conductors V22 are formed in the base member 13. The interlayer connection conductors V11 are formed in the base members 13, 12, and 11.

Although a module, which is a single unit, is illustrated in FIG. 4 and FIG. 5, in practice, an aggregate substrate including a plurality of module forming portions is subjected to the processing operations in each step (is manufactured through a large-format process) and finally is divided into individual pieces.

The protective films 21 and 22 illustrated in FIG. 4 are preferably, for example, polyimide sheets. The base members 11, 12, 13, and 14 together with the protective films 21 and 22 are laminated and hot-pressed. Through this step, the multilayer body 10 is formed. Furthermore, through the step, the compositions of the interlayer connection conductors V11, V12, and V22 are melted once, alloying occurs or an intermetallic compound is generated, and then solidifying occurs, so that the interlayer connection conductors V11, V12, and V22 are formed. The remelting temperature of each of the interlayer connection conductors V11, V12, and V22 after they are formed once is higher than the temperature at which the hot pressing is performed. Through this step, as illustrated in (1) of FIG. 5, the protective film 21 is formed so as to cover the first region Z1 of the first main surface S1 of the multilayer body 10 and so as to expose the second regions Z2 thereof when the multilayer body 10 is viewed in plan view. In other words, the second regions Z2 of the first main surface S1 are regions in which the first conductor pattern 31 and the protective film 21 are not formed.

As illustrated in (2) of FIG. 5, after the step of forming the multilayer body 10 has been performed, the holes HG1, HG2, and HS extending to the second conductor patterns 32G and 32S1 are formed in the second regions Z2 of the first main surface S1 of the multilayer body 10. For example, the holes HG1, HG2, and HS are preferably formed by radiating laser onto predetermined positions in the second regions Z2. In this case, the second conductor patterns 32G and 32S1 act as laser-stop layers. The state illustrated in (2) of FIG. 5 is the state of the resin multilayer substrate 101.

As illustrated in (3) of FIG. 5, the holes HG1, HG2, and HS are provided or filled with the conductive joining materials BG1, BG2, and BS, respectively. The conductive joining materials BG1, BG2, and BS are preferably Sn-based solder, for example, and the melting point of each of the conductive joining materials BG1, BG2, and BS is lower than the remelting temperature of each of the interlayer connection conductors V11, V12, and V22. The state illustrated in (3) of FIG. 5 is the state of a transmission line 111.

As illustrated in (4) of FIG. 5, the connectors 91 and 92 are mounted onto the multilayer body 10 through the conductive joining materials BG1, BG2, and BS. More specifically, the connectors 91 and 92 are mounted onto the transmission line 111, which is illustrated in (3) of FIG. 5, and soldering is performed through a reflow process. Remelting of the interlayer connection conductors V11, V12, and V22 does not occur at the temperature at which the reflow process is performed.

According to the present preferred embodiment, as illustrated in FIG. 2A, since there is neither protective film nor joining electrode between the bottom surfaces of the connectors 91 and 92 and the first main surface S1 of the multilayer body 10, and the bottom surfaces of the connectors 91 and 92 are in contact with the first main surface S1 of the multilayer body 10, the heights of the connectors 91 and 92 from the surface of the multilayer body 10 are small, and the thickness of a component mounting portion is reduced.

In addition, since the thin-layer portions TP1 and TP2 are located close to the positions at which the connectors 91 and 92 are mounted, the module 121 is able to be used as a connector-equipped high-frequency cable having flexibility while the rigidity of the portions on which the connectors 91 and 92 are mounted is ensured.

Second Preferred Embodiment

In a second preferred embodiment of the present invention, an example in which the structure of the multilayer body is different from that of the multilayer body according to the first preferred embodiment will be described.

Figure 6:
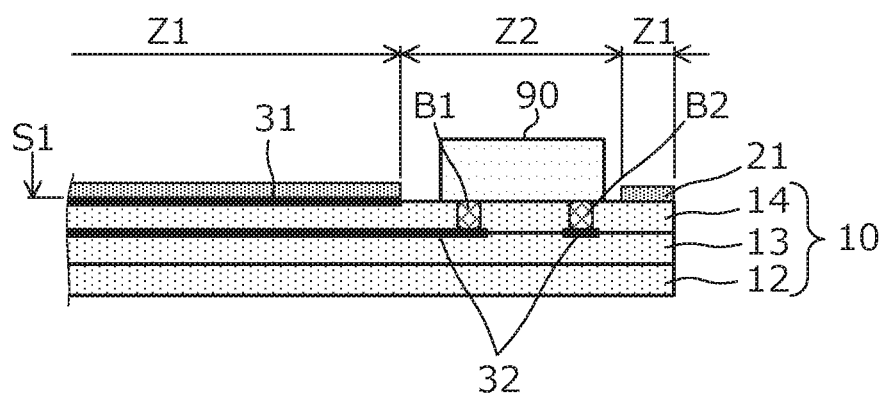
FIG. 6 is a sectional view of a principal portion of a module according to a second preferred embodiment of the present invention.

FIG. 6 is a sectional view of a principal portion of a module 122 according to the second preferred embodiment. The module 122 includes the multilayer body 10 including the insulating-resin base members 12, 13, and 14, the protective film 21 provided on a surface of the multilayer body 10, and a component 90 mounted on the multilayer body 10.

When viewed in plan view, the multilayer body 10 includes the first region Z1 and the second region Z2, and the protective film 21 covers the first region Z1 of the first main surface S1 of the multilayer body 10.

The first conductor pattern 31 is provided on the top surface of the base member 14, that is, the first main surface S1 of the multilayer body 10. A second conductor pattern 32 is provided on the top surface of the base member 13 (in an inner layer of the multilayer body 10). For example, the first conductor pattern 31 and the second conductor pattern 32 are a ground conductor pattern and a signal conductor pattern, respectively, and the ground conductor pattern and the signal conductor pattern define a microstripline.

In the second regions Z2 of the first main surface S1 of the multilayer body 10, conductive joining materials B1 and B2 are provided in holes that extend to the second conductor pattern 32, and the component 90 is electrically connected to the second conductor pattern 32 by the conductive joining materials B1 and B2.

A method of manufacturing the module 122 according to the present preferred embodiment is the same or substantially the same as the method described in the first preferred embodiment.

Note that although, in each of the above-described preferred embodiments, a case has been described in which a terminal electrode of a component is electrically connected to the second conductor pattern only by the conductive joining material that is provided in the hole provided in the second regions Z2 of the first main surface S1, an interlayer connection conductor may be provided in a portion of the hole, and the conductive joining material may be provided in the remaining portion of the hole. As a result, the amount of the conductive joining material to be provided in the hole is able to be reduced. In addition, the conductive joining material is able to be easily provided in the hole even in the case in which the hole is deep.

Although, in each of the above-described preferred embodiments, a case has been described in which a protective film is provided of a resin sheet that undergoes hot pressing at the same time that a multilayer body is formed, a protective film may be provided by applying and forming a resist film onto a surface of the multilayer body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a multilayer body that includes a plurality of insulating-resin base members, which are laminated together, and includes a first main surface and a second main surface, the multilayer body including a first region and a second region when viewed in plan view;
   a first conductor pattern that is provided in the first region of the first main surface;
   a protective film that is provided in the first region of the first main surface and that covers the first conductor pattern;
   a second conductor pattern that is provided in at least the second region of an inner layer of the multilayer body; and
   a hole that is provided in the second region of the first main surface and that extends to the second conductor pattern; wherein
   the second region of the first main surface is a region in which the first conductor pattern is not provided; and
   the second region is surrounded by the protective film.

2. The resin multilayer substrate according to claim 1, wherein the multilayer body includes a thin-layer portion that is located in the first region and in which a number of the plurality of insulating-resin base members laminated together is smaller than a number of the plurality of insulating-resin base members laminated together in another portion of multilayer body.

3. The resin multilayer substrate according to claim 2, wherein
the second conductor pattern extends through the thin-layer portion when the multilayer body is viewed in plan view; and
the multilayer body further includes an interlayer connection conductor that provides interlayer connection between the first conductor pattern and the second conductor pattern.

4. The resin multilayer substrate according to claim 1, further comprising:
a third conductor pattern provided on the second main surface of the multilayer body.

5. The resin multilayer substrate according to claim 4, wherein
the first conductor pattern is an upper ground conductor extending in a planar manner;
the third conductor pattern is a lower ground conductor extending in a planar manner; and
the second conductor pattern is a signal conductor pattern extending between the first conductor pattern and the third conductor pattern.

6. The resin multilayer substrate according to claim 4, wherein the first, second, and third conductor patterns define a stripline.

7. A transmission line comprising:
the resin multilayer substrate according to claim 1; wherein
the first conductor pattern is a ground conductor pattern, and an entirety of the second conductor pattern or a portion of the second conductor pattern is a signal conductor pattern extending along the first conductor pattern.

8. The transmission line according to claim 7, wherein the multilayer body includes a thin-layer portion that is located in the first region and in which a number of the plurality of insulating-resin base members laminated together is smaller than a number of the plurality of insulating-resin base members laminated together in another portion of multilayer body.

9. The transmission line according to claim 8, wherein
the second conductor pattern extends through the thin-layer portion when the multilayer body is viewed in plan view; and
the multilayer body further includes an interlayer connection conductor that provides interlayer connection between the first conductor pattern and the second conductor pattern.

10. The transmission line according to claim 7, further comprising:
a third conductor pattern provided on the second main surface of the multilayer body.

11. The transmission line according to claim 10, wherein
the first conductor pattern is an upper ground conductor extending in a planar manner;
the third conductor pattern is a lower ground conductor extending in a planar manner; and
the signal conductor pattern extends between the first conductor pattern and the third conductor pattern.

12. The transmission line according to claim 10, wherein the first, second, and third conductor patterns define a stripline.

13. A module comprising:
the resin multilayer substrate according to claim 1;
a conductive joining material that is provided in the hole and that has a melting point lower than a remelting temperature of a conductor that defines an interlayer connection conductor provided in an inner layer of the multilayer body; and
a component that is connected to the second conductor pattern by the conductive joining material and that is mounted on the multilayer body.

14. The module according to claim 13, further comprising:
an interlayer connection conductor that is provided in the hole and that is electrically connected to the conductive joining material.

15. The module according to claim 13, wherein the component is a connector that is connected to an external circuit.

16. The module according to claim 13, wherein the multilayer body includes a thin-layer portion that is located in the first region and in which a number of the plurality of insulating-resin base members laminated together is smaller than a number of the plurality of insulating-resin base members laminated together in another portion of multilayer body.

17. The module according to claim 16, wherein the second conductor pattern extends through the thin-layer portion when the multilayer body is viewed in plan view.

18. The module according to claim 13, further comprising:
a third conductor pattern provided on the second main surface of the multilayer body.

19. The module according to claim 18, wherein
the first conductor pattern is an upper ground conductor extending in a planar manner;
the third conductor pattern is a lower ground conductor extending in a planar manner; and
the second conductor pattern is a signal conductor pattern extending between the first conductor pattern and the third conductor pattern.

* * * * *